(12) United States Patent
Hsing Chen et al.

(10) Patent No.: US 10,631,383 B2
(45) Date of Patent: Apr. 21, 2020

(54) ILLUMINANT MODULE

(71) Applicant: ProLight Opto Technology Corporation, Taoyuan (TW)

(72) Inventors: Chen-Lun Hsing Chen, Taoyuan (TW); Jung-Hao Hung, Taoyuan (TW); Ya-Yu Hung, Taoyuan (TW); Cheng-Tsan Tang, Taoyuan (TW)

(73) Assignee: PROLIGHT OPTO TECHNOLOGY CORPORATION, Taoyuan (TW)

( * ) Notice: Subject to any disclaimer, the term of this patent is extended or adjusted under 35 U.S.C. 154(b) by 314 days.

(21) Appl. No.: 15/616,329

(22) Filed: Jun. 7, 2017

(65) Prior Publication Data
US 2018/0116028 A1    Apr. 26, 2018

(30) Foreign Application Priority Data

Oct. 21, 2016 (TW) .............................. 105216077 U

(51) Int. Cl.
| | |
|---|---|
| *H05B 45/20* | (2020.01) |
| *F21K 9/238* | (2016.01) |
| *F21K 9/237* | (2016.01) |
| *F21V 29/77* | (2015.01) |
| *H01L 25/075* | (2006.01) |

(Continued)

(52) U.S. Cl.
CPC ............. *H05B 45/20* (2020.01); *F21K 9/237* (2016.08); *F21K 9/238* (2016.08); *F21V 23/005* (2013.01); *F21V 23/06* (2013.01); *F21V 29/67* (2015.01); *F21V 29/77* (2015.01); *F21V 29/773* (2015.01); *H01L 25/0753* (2013.01); *H01L 27/156* (2013.01); *H01L 33/504* (2013.01); *H01L 33/62* (2013.01); *F21V 3/00* (2013.01);

(Continued)

(58) Field of Classification Search
CPC ... H05B 33/0857; H05B 45/20; H01L 25/167; H01L 25/0753; H01L 27/156; H01L 33/504; H01L 33/62; F21V 3/02; F21V 29/67; F21V 29/77; F21V 29/773; F21V 23/005; F21V 23/06; F21V 3/00; F21K 9/238; F21K 9/237; F21Y 2105/12; F21Y 2113/17
USPC .................................................... 362/249.02
See application file for complete search history.

(56) References Cited

U.S. PATENT DOCUMENTS

| | | | |
|---|---|---|---|
| 2014/0191655 A1* | 7/2014 | Kasakura | H01L 25/0753 315/32 |
| 2017/0099709 A1* | 4/2017 | Loveridge | H05B 33/0812 |

* cited by examiner

*Primary Examiner* — Anh T Mai
*Assistant Examiner* — Jessica M Apenteng
(74) *Attorney, Agent, or Firm* — Chun-Ming Shih; HDLS IPR Services

(57) ABSTRACT

An illuminant module includes a first illuminant unit, a second illuminant unit, a first phosphor layer, and a second phosphor layer. The first illuminant unit includes one or more first LED dice and a current regulator electrically connected to the LED dice in series. The second illuminant unit includes one or more second LED dice. The first phosphor layer at least covers the first LED dice, wherein first phosphor layer and the first LED dice collectively provide an emission having a first color temperature. The second phosphor layer at least covers the second LED dice, wherein second phosphor layer and the second LED dice collectively provide an emission having a second color temperature, the current regulator is configured to adjust currents flowing to the first illuminant unit and the second illuminant unit for changing luminous flux of emissions emitted from the first illuminant unit and the second illuminant unit.

16 Claims, 4 Drawing Sheets

(51) Int. Cl.
*F21V 29/67* (2015.01)
*F21V 23/00* (2015.01)
*F21V 23/06* (2006.01)
*H01L 27/15* (2006.01)
*H01L 33/50* (2010.01)
*H01L 33/62* (2010.01)
*F21Y 113/17* (2016.01)
*F21Y 105/12* (2016.01)
*F21V 3/02* (2006.01)
*H01L 25/16* (2006.01)
*F21V 3/00* (2015.01)

(52) U.S. Cl.
CPC .............. *F21V 3/02* (2013.01); *F21Y 2105/12* (2016.08); *F21Y 2113/17* (2016.08); *H01L 25/167* (2013.01)

ILLUMINANT MODULE

BACKGROUND

Technical Field

The present disclosure relates to an illuminant module. More particularly, the present disclosure relates to an LED-based illuminant module having adjustable color temperature.

Description of Related Art

A light emitting diode (LED) is a kind of semiconductor device, which exploits the property of direct-bandgap semiconductor material to convert electric energy into light energy efficiently and has advantages of long lifetime, high stability, and low power consumption and is widely used in vehicle lighting.

Generally, the LED lamp having adjustable color temperature includes multiple LEDs divided up into two (or more) parallel strings. This in turn requires different drivers for different LED strings, which raises the complexity of the drivers, and the LED lamp having the drivers is expensive and bulk and cannot be compatible with fixtures designed for MR16.

SUMMARY

According to one aspect of the present disclosure, an illuminant module includes at least one first illuminant unit, at least one second illuminant unit, a first phosphor layer, and a second phosphor layer. The first illuminant unit includes one or more first light emitting diode (LED) dice and a current regulator electrically connected to the light emitting diode dice in series. The second illuminant unit includes one or more second LED dice. The first phosphor layer at least covers the first LED dice, wherein first phosphor layer and the first LED dice collectively provide an emission having a first color temperature. The second phosphor layer at least covers the second LED dice, wherein second phosphor layer and the second LED dice collectively provide an emission having a second color temperature, the current regulator is configured to adjust currents flowing to the first illuminant unit and the second illuminant unit for changing luminous flux of emissions emitted from the first illuminant unit and the second illuminant unit to adjust a color temperature of the illuminant module.

In an embodiment of the present embodiment, the illuminant module further includes a substrate, the first illuminant unit and the second illuminant unit disposed on the substrate, wherein an anode connecting pad, a cathode connecting pad, a first wiring, and a second wiring are mount on the substrate, the first wiring is connected to the anode connecting pad, the first LED dice, and the second LED dice, and the second wiring is connected to the cathode connecting pad, the first LED dice, and the second LED dice, the resistance of the first wiring is equal to the resistance of the second wiring.

In an embodiment of the present embodiment, the first phosphor layer covers the first LED dice and the current regulator.

In an embodiment of the present embodiment, the illuminant module includes a plurality of second illuminant units, and the first illuminant unit is arranged between the second illuminant units.

In an embodiment of the present embodiment, the second phosphor layer covers the second LED dice and the current regulator.

In an embodiment of the present embodiment, the illuminant module further includes at least one surrounding wall disposed on the substrate, the first LED dice and the first phosphor are disposed within the surrounding wall.

In an embodiment of the present embodiment, the illuminant module further includes a dam disposed on the substrate and surrounds the first illuminant unit, the second illuminant unit, the first phosphor layer, and the second phosphor layer.

In an embodiment of the present embodiment, a waveband of the blue emission from the first LED dice is the same as that of the blue emissions from the second LED dice.

In an embodiment of the present embodiment, the current regulator is a current regulative diode or constant current regulator.

According to another aspect of the present disclosure, a light emitting diode (LED) lamp includes the illuminant module mentioned above, a housing, a shield, a heat sink, an electrical connector, and an electronic circuit module. The illuminant module is disposed at the housing, the shield is assembled with the housing, such that the illuminant module is arranged between the housing and the shield. The heat sink is connected to the housing and comprising a plurality of heat-dissipating fans, the electrical connector 100 is connected to the housing, and the electronic circuit module is arranged inside the electrical connector and electrically connected to the illuminant module and the electrical connector.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
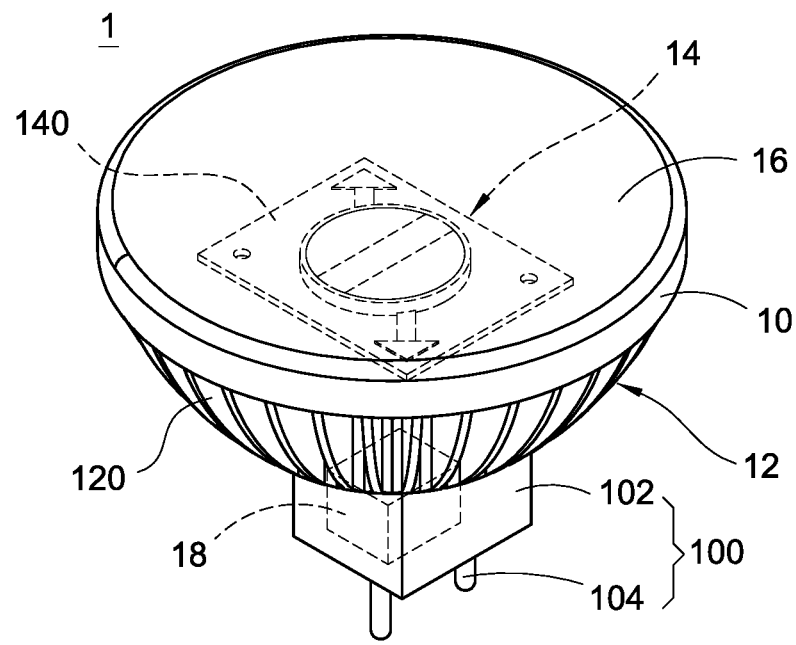
FIG. 1 is a perspective view of a light emitting diode (LED) lamp according to a 1st embodiment of the present disclosure.

Reference is made to FIG. 1, which is a perspective view of a light emitting diode (LED) lamp according to a 1st embodiment of the present disclosure. The LED lamp 1 includes a housing 10, a heat sink 12, an illuminant module 14, and a shield 16. The housing 10 is formed with an accommodation chamber (its reference numeral is omitted) providing location of the illuminant module 14. The housing 10 includes an electrical connector 100. In FIG. 1, the housing 10 is of type MR16 and has an insulation socket 102 and a pair of pins 104; an electronic circuit module 18 is arranged inside the insulation socket 102 for power conversion (such as convers an AC electricity into a specific electricity to meet to the requirement of the illuminant module 14) and driving the illuminant module 14. The pins 104 are fixed to one end (bottom) of the insulation socket 102 and coupled to the electronic circuit module 18 and a circuit board 140 of the illuminant module 14 so as to transmit the electricity to the electronic circuit module 18 and the illuminant module 14. In the practical applications, the housing 10 may be made to conform to another standard lamp form factor, such as E14, E17, E26 or E40.

The heat sink 12 made of highly thermal conductive material is connected to the housing 10 and includes a plurality of heat-dissipating fins 120. These heat-dissipating fins 120 are spaced in intervals around an outer surface of the housing 10 and a plurality of channels (its reference numeral is omitted) are formed between the heat-dissipating fins 120 for air to flow through and take away the heat from the heat sink 12. The heat dissipating fins 120 can be flat or curved.

Figure 2:
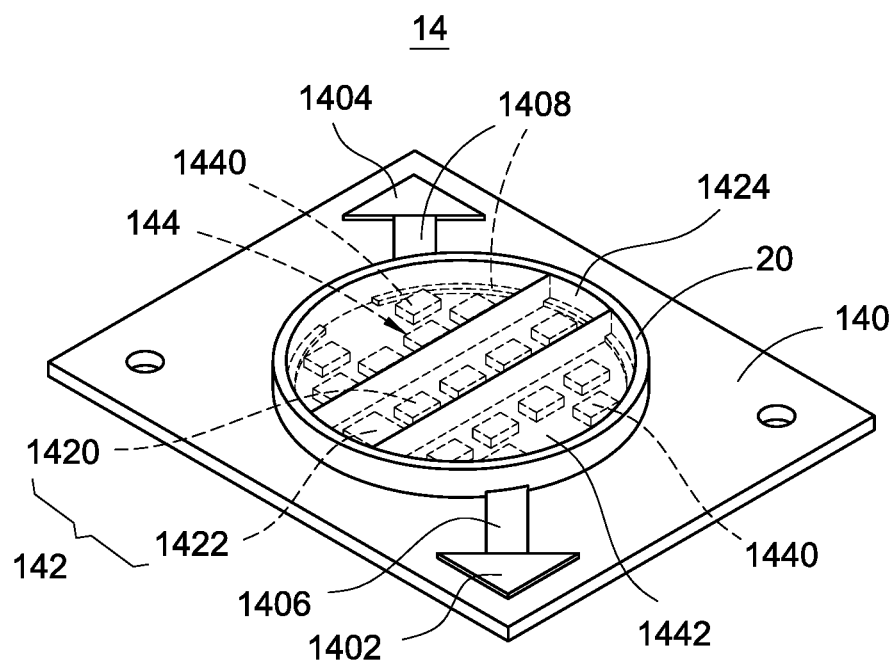
FIG. 2 is a perspective view of an illuminant module according to the 1st embodiment of the present disclosure.
Figure 3:
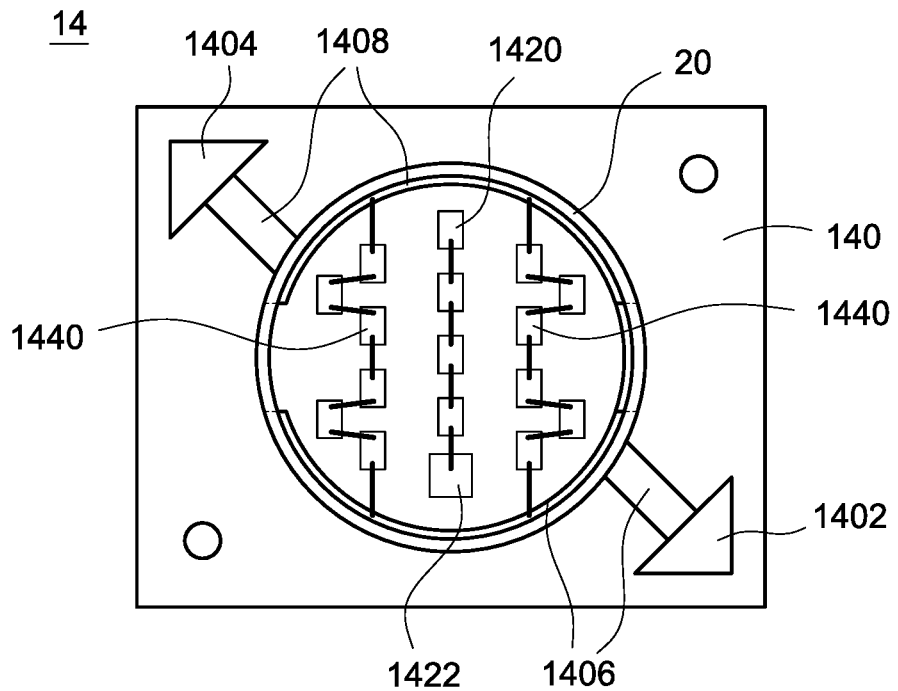
FIG. 3 is a top view of the illuminant module according to the 1st embodiment of the present disclosure.

The illuminant module 14 is arranged at the accommodation chamber of the housing 10, and shield 16 is engaged with a flared end (top) of the housing 10 by tight fit, such that the illuminant module 14 is arranged between the housing 10 and the shield 16, and when the illuminant module 14 is on, the light generated from the illuminant module 14 is emitted through the shield 16. The profile of the shield 16 may be designed to make a focusing effect, a diffusing effect, or a collimating effect, so that the light projected from the illuminant module 14 can be limited to a specific angle FIG. 2 is a perspective view of an illuminant module according to the 1st embodiment of the present disclosure, and FIG. 3 is a top view of the illuminant module according to the 1st embodiment of the present disclosure. The illuminant module 14 includes a substrate 140, one or more first illuminant unit 142, and one or more second illuminant unit 144. In FIG. 2 and FIG. 3, the illuminant module 14 includes, for example, one first illuminant unit 142 and two second illuminant units 144, and the first illuminant unit 142 is arranged between the second illuminant units 144 for enhancing uniformity. In the practical applications, the illuminant module 14 may include a plurality of first illuminant units 142 and a plurality of second illuminant units 144, and the first illuminant units 142 and the second illuminant units 144 are, for example, in staggered arrangement for enhancing uniformity.

An anode connecting pad 1402, a cathode connecting pad 1404, a first wiring 1406, and a second wiring 1408 are mount on the substrate 140. The first wiring 1406 may be arranged between the anode connecting pad 1402, the first illuminant unit 142, and the second illuminant unit 144 and electrically connected thereto; the second wiring 1408 may be arranged between the cathode connecting pad 1404, the first illuminant unit 142, and the second illuminant unit 144 and electrically connected thereto. The first wiring 1406 and the second wiring 1408 are symmetrically mounted on the substrate 140, such that the resistance of the first wiring 1406 is equal to that of the second wiring 1408. The first wiring 1406 and the second wiring 1408 are made of conductive material, such as silver.

In addition, the anode electrical pad 1402 and the cathode electrical pad 1404 may be electrically connected to the electronic circuit module 18 via conducting wires. The substrate 140 may be metal core substrate or ceramic substrate; wherein the metal core substrate and the ceramic substrate have higher thermal conductivity than general printed circuit board for rapidly conduct heat generated by the first illuminant unit 142 and the second illuminant units 144, thus color shift issue depending on the junction temperature is overcome.

Figure 4:
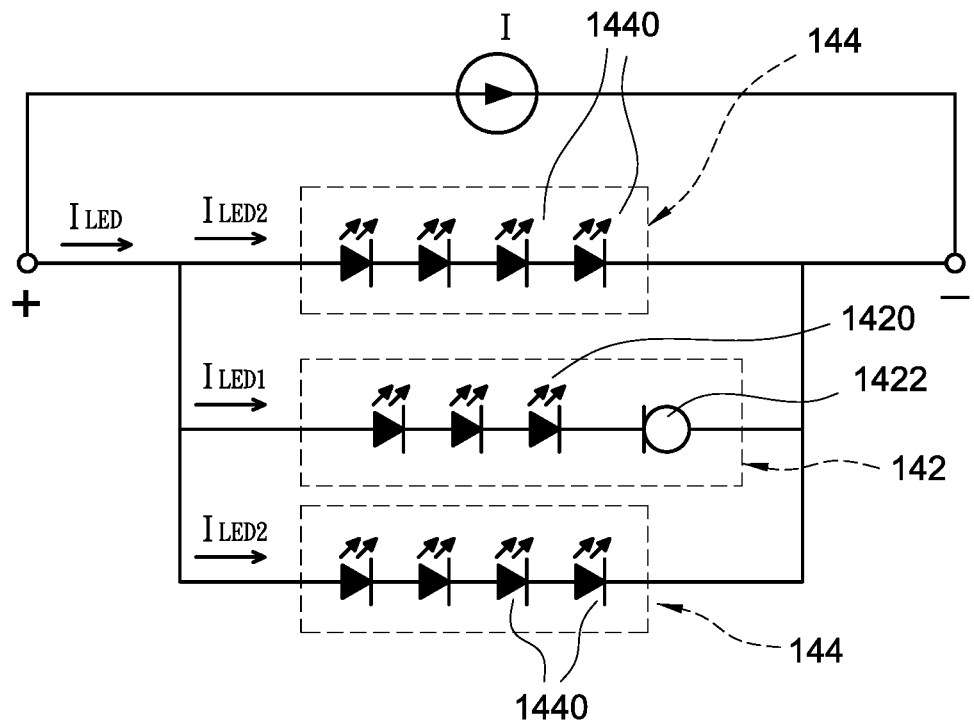
FIG. 4 is a circuit diagram of the illuminant module according to the 1st embodiment of the present disclosure.

FIG. 4 is a circuit diagram of the illuminant module according to the 1st embodiment of the present disclosure. In FIG. 4, the first illuminant unit 142 and the second illuminant units 144 are electrically connected in parallel, and the first illuminant unit 142 and the second illuminant units 144 in the parallel connected is further electrically connected to a current source I. The first illuminant unit 142 includes one or more first LED dice 1420 and a current regulator 1422; the first LED dice 1420 are blue LED dice for producing blue emissions, and the current regulator 1422 is electrically connected to the first LED dice 1422 in series. In should be noted that when the first illuminant unit 142 includes multiple first LED dice 1422, the first LED dice 1422 are electrically connected in series, and the first LED dice 1422 in series connection is further electrically connected to the current regulator 1422 in series. The current regulator 1422 is configured to adjust the current flowing to the first illuminant unit 142, such that the luminous flux is changed for adjusting color temperature of the illuminant module 14. The current regulator 1422 is a current regulative diode (CRD) or constant current regulator (CCR).

With referring again to FIG. 2; the illuminant module 14 further includes a first phosphor layer 1424 covering the first LED dice 1420. A first phosphor powder in the first phosphor layer 1424 produces yellow fluorescence on adsorbing the blue emissions from the first LED dice 1420. Part of the blue emissions emitted from the first LED dice 1420 pass through the first phosphor powder, while part of the blue emissions emitted from the first LED dice 1420 is absorbed by the first phosphor powder, which becomes excited and emits a yellow emission. The part of the blue emissions emitted by the first LED dice 1420, which is transmitted through the first phosphor powder, is mixed with the yellow emissions emitted by the first phosphor powder. The viewer perceives the mixture of blue and yellow emissions as white emission having a first color temperature. The first phosphor layer 1424 is, for example, formed by mixing an optical-transparent resin (such as silicone) with the first phosphor powder.

The second illuminant unit 144 includes a plurality of second LED dice 1440 electrically connected in series. The second LED dices 1440 are blue LED dice for producing blue emissions. The illuminant module 14 may further include a second phosphor layer 1442 covering the second LED dice 1440. A second phosphor powder in the second phosphor layer 1444 produces yellow fluorescence on adsorbing the blue emissions from the second LED dice 1440. Part of the blue emissions emitted from the second LED dice 1440 pass through the second phosphor powder, while part of the blue emissions emitted from the second LED dice 1440 is absorbed by the second phosphor powder, which becomes excited and emits a yellow emission. The part of the blue emissions emitted by the second LED dice 1440, which is transmitted through the second phosphor powder, is mixed with the yellow emissions emitted by the second phosphor powder. The viewer perceives the mixture of blue and yellow emissions as white emission having a second color temperature. The second phosphor layer 1444 is, for example, formed by mixing an optical-transparent resin (such as silicone) with the second phosphor powder.

Notably, in the illuminant module 14 of the present disclosure, the waveband of the yellow fluorescence on adsorbing the blue emissions from the first LED dice 1420 is different from that of the yellow fluorescence on adsorbing the blue emissions from the second LED dice 1440. In the other words, the first phosphor powder of the first phosphor layer 1424 is different from the second phosphor powder of the second phosphor layer 1444. The optical-transparent of the first phosphor layer 1424 may be the same as the optical-transparent of the second phosphor layer 1444 for lowering complexity and reducing the cost. However, in the practical applications, the optical-transparent of the first phosphor layer 1424 may be different from the optical-transparent of the second phosphor layer 1444 to meet the demanded manufacture and product condition.

In addition, the waveband of the blue emission from the first LED dice 1420 is, for example, the same as that of the blue emissions from the second LED dice 1440 for lowering complexity and reducing the cost. However, in the practical applications, the waveband of the blue emission from the first LED dice 1420 may be different from that of the blue emissions from the second LED dice 1440 for providing high light distribution properties and color rendering index.

Figure 5:
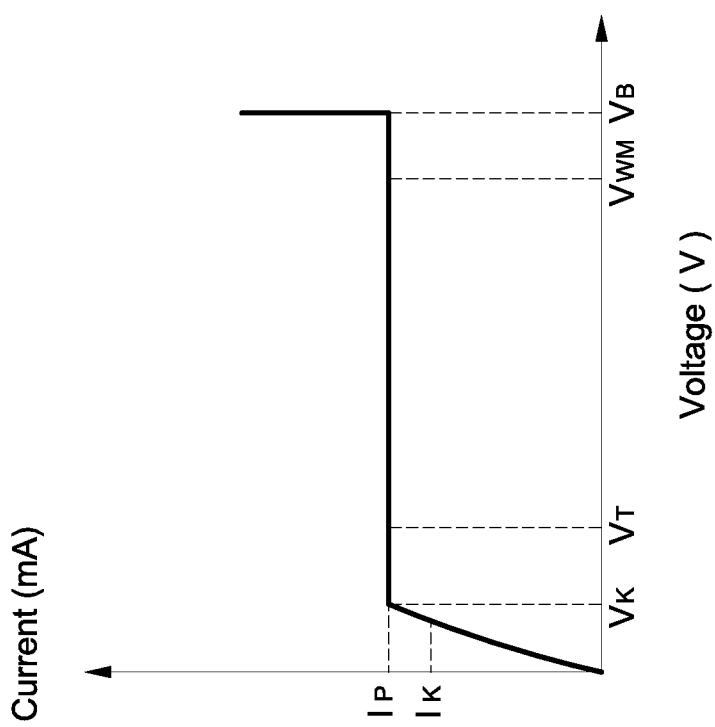
FIG. 5 is a schematic graph showing I-V curve of a constant current component according to the 1st embodiment of the present disclosure.

FIG. 5 is a schematic graph showing I-V curve of a constant current component according to the 1st embodiment of the present disclosure. In FIG. 5, $I_P$ is a pinch-off current of the current regulator 1422, $V_B$ is a breakdown voltage of the current regulator 1422, $V_{WM}$ is a maximum working voltage of the current regulator 1422, $V_T$ is a cut-in voltage of the current regulator 1422, $I_K$ is a critical current, and the following condition is satisfied: $I_K=0.8I_P$. $V_K$ is a critical voltage while the current flowing to the current regulator 1422 to be equal to the critical current $I_K$. In operation, the voltage drop across the current regulator 1422 is limited to a value below the breakdown voltage ($V_B$) for preventing the first LED dice 1420 and the second LED dice 1440 from damage.

As can be seen in FIG. 5, when the voltage drop across the current regulator 1422 is equal to or greater than the cut-in voltage ($V_T$) and smaller than the breakdown voltage ($V_B$), the current regulator 1422 provides a constant current (i.e., the pinch-off current ($I_P$) abovementioned). Therefore, when the current flowing to the first illuminant unit 142 is $I_{LED1}$, the current flowing to the second illuminant unit 144 is $I_{LED2}$, and the following conditions are satisfied:

$I_{LED1}=I_P$; and $I_{LED2}=(I_{LED}-I_P)/2$.

In addition, when the voltage drop across the current regulator 1422 is smaller than the cut-in voltage ($V_T$) and, for example, equal to the critical voltage ($V_K$), the following conditions are satisfied:

$I_{LED1}=I_K$; and $I_{LED2}=(I_{LED}-I_K)/2$.

A change in the ratio of the current flowing to the first illuminant unit 142 to the current flowing to the second illuminant unit 144 does not lead to a change in the color temperatures of the emissions emitted from the first LED dice 1420 and the second LED dice 1440, but leads to a change in the ratio of the luminous flux of the emission emitted from the first LED dice 1420 to the luminous flux of the emission emitted from the second LED dice 1440. Therefore, the color temperature of the light from the illuminant module 14 can be changed. The color temperature of the illuminant module 14 is adjusted while the ratio of the luminous flux of the emission emitted from the first LED dice 1420 to the luminous flux of the emission emitted from the second LED dice 1440 is changed since the color temperature of the illuminant module 14 is a mixture of the emissions from the first LED dice 1420 and the second LED dice 1440. In short, the present disclosure adjusted the color temperature by changing the ratio of the luminous flux of the emission emitted from the first LED dice 1420 to the luminous flux of the emission emitted from the second LED dice 144.

With referring again to FIG. 2; the illuminant module 14 further includes a dam 20 having a round-shape and surrounding the first illuminant unit 142, the second illuminant unit 144, the first phosphor layer 1424, and the second phosphor layer 1442. The dam is, for example, made of non-conducting material and disposed on the circuit board 140 in a ring-shape. The dam 20 is used for preventing the first phosphor layer 1424 and the second phosphor layer 1442 from deformation or collapse.

Figure 6:
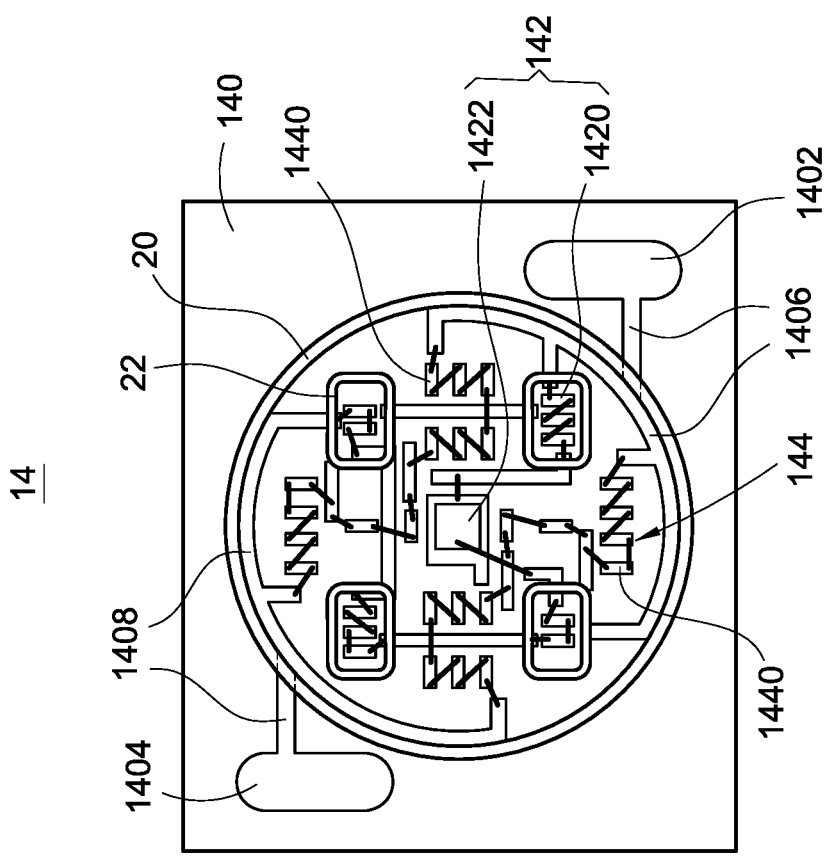
FIG. 6 is a top view of an illuminant module according to a 2nd embodiment of the present disclosure.
Figure 7:
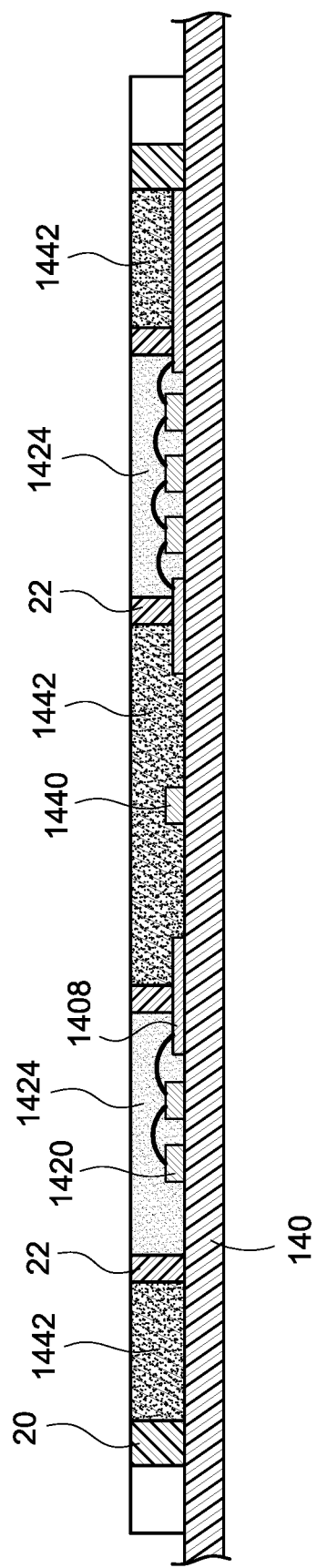
FIG. 7 is a sectional view of the illuminant module according to the 2nd embodiment of the present disclosure.

FIG. 6 is a top view of an illuminant module according to a 2nd embodiment of the present disclosure, and FIG. 7 is a sectional view of the illuminant module according to the 2nd embodiment of the present disclosure. In FIG. 6 and FIG. 7, the illuminant module 14 includes a substrate 140, one or more first illuminant units 142, one or more second illuminant units 144, a first phosphor layer 1424, and a second phosphor layer 1442. An anode connecting pad 1402, a cathode connecting pad 1404, a first wiring 1406, and a second wiring 1408 are mount on the substrate 140. The first wiring 1406 may be arranged between the anode connecting pad 1402, the first illuminant unit 142, and the second illuminant unit 144 and electrically connected thereto; the second wiring 1408 may be arranged between the cathode connecting pad 1404, the first illuminant unit 142, and the second illuminant unit 144 and electrically connected thereto. The first wiring 1406 and the second wiring 1408 are symmetrically mounted on the substrate 140, such that the resistance of the first wiring 1406 is equal to that of the second wiring 1408. The first wiring 1406 and the second wiring 1408 are made of conductive material, such as silver.

The illuminant module 14 further includes a dam 20 and a plurality of surrounding walls 22; the surrounding walls 22 are disposed on the substrate 140. The surrounding walls 22 may be, for example, space equally apart from each other, and a plurality of chamfers A are formed on corners of the surrounding walls 22. The dam 20 has a round-shape and surrounds the first illuminant unit 142, the second illuminant unit 144, the first phosphor layer 1424, the second phosphor layer 1442, and the surrounding walls 22.

The first illuminant unit 142 includes a plurality of first LED dice 1420 and a current regulator 1422; the first LED dice 1420 are places on the substrate 140 and in the surrounding walls 22. The first LED dice 1420 for producing blue emissions are electrically connected in series via wires. In should be noted that an amount of the first LED dice 1420 in each surrounding wall 22 may be varied in accordance with demanded lighting pattern and uniformity. For example, there are two first LED dice 1420 in some of the surrounding walls 22, and there are three first LED dice 1420 in the other surrounding walls 22 shown in FIG. 6. However, in the practical applications, the amount of the first LED dice 1420 in each surrounding wall 22 may be a constant.

The current regulator 1422 is placed at a center of the substrate 140 and electrically connected to the first LED dice 1420 in series. The current regulator 1422 is configured to adjust the current flowing to the first illuminant unit 142 for charging luminous flux of the emission from the first LED dice 1420 so as to change the color temperature of the illuminant module 14.

The first phosphor layer 1424 is disposed in the surrounding walls 22 and covers the first LED dice 1420. The surrounding walls 22 are used for preventing the first phosphor layer 1424 and the second phosphor layer 1442 from deformation or collapse. A first phosphor powder in the first phosphor layer 1424 produces yellow fluorescence on adsorbing the blue emissions from the first LED dice 1420. Part of the blue emissions emitted from the first LED dice 1420 pass through the first phosphor powder, while part of the blue emissions emitted from the first LED dice 1420 is absorbed by the first phosphor powder, which becomes excited and emits a yellow emission. The part of the blue emissions emitted by the first LED dice 1420, which is transmitted through the first phosphor powder, is mixed with the yellow emissions emitted by the first phosphor powder. The viewer perceives the mixture of blue and yellow emissions as white emission having a first color temperature.

The second illuminant units 144 includes a plurality of second LED dice 1440 placed on the substrate 140. The second LED dice 1440 electrically connected in series via wires are blue LED dice for producing blue emissions.

The second phosphor layer 1442 is dispose between the dam 20 and the surrounding walls 22 and covers the second LED dice 1440. A second phosphor powder in the second phosphor layer 1444 produces yellow fluorescence on adsorbing the blue emissions from the second LED dice 1440. Part of the blue emissions emitted from the second LED dice 1440 pass through the second phosphor powder, while part of the blue emissions emitted from the second LED dice 1440 is absorbed by the second phosphor powder, which becomes excited and emits a yellow emission. The part of the blue emissions emitted by the second LED dice 1440, which is transmitted through the second phosphor powder, is mixed with the yellow emissions emitted by the second phosphor powder. The viewer perceives the mixture of blue and yellow emissions as white emission having a second color temperature. The second phosphor layer 1444 is, for example, formed by mixing an optical-transparent resin (such as silicone) with the second phosphor powder.

The current regulator 1422 is configured to change a ratio of the current flowing to the first illuminant unit 142 to the current flowing the second illuminant unit 144.

A change in the ratio of the current flowing to the first illuminant unit 142 to the current flowing to the second illuminant unit 144 does not lead to a change in the color temperatures of the emissions emitted from the first LED dice 1420 and the second LED dice 1440, but leads to a change in the ratio of the luminous flux of the emission emitted from the first LED dice 1420 to the luminous flux of the emission emitted from the second LED dice 1440. Therefore, the color temperature of the light from the illuminant module 14 can be changed.

The color temperature of the illuminant module 14 is adjusted while the ratio of the luminous flux of the emission emitted from the first LED dice 1420 to the luminous flux of the emission emitted from the second LED dice 1440 is changed since the color temperature of the illuminant module 14 is a mixture of the emissions from the first LED dice 1420 and the second LED dice 1440.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. An illuminant module, comprising:
   at least one first illuminant unit comprising one or more first light emitting diode (LED) dice and a current regulator electrically connected to the light emitting diode dice in series;
   at least one second illuminant unit comprising one or more second LED dice;
   a first phosphor layer at least covering the first LED dice, wherein first phosphor layer and the first LED dice collectively provide an emission having a first color temperature;
   a second phosphor layer at least covering the second LED dice, wherein second phosphor layer and the second LED dice collectively provide an emission having a second color temperature;
   wherein the current regulator is configured to adjust currents flowing to the first illuminant unit and the second illuminant unit for changing luminous flux of emissions emitted from the first illuminant unit and the second illuminant unit to adjust a color temperature of the illuminant module;
   wherein the first illuminant unit and the second illuminant unit disposed on the substrate, wherein an anode connecting pad, a cathode connecting pad, a first wiring, and a second wiring are mount on the substrate, the first wiring is connected to the anode connecting pad, the first LED dice, and the second LED dice, and the second wiring is connected to the cathode connecting pad, the first LED dice, and the second LED dice, the resistance of the first wiring is equal to the resistance of the second wiring.

2. The illuminant module of claim 1, wherein the first phosphor layer covers the first LED dice and the current regulator.

3. The illuminant module of claim 2, wherein the illuminant module comprises a plurality of second illuminant units, and the first illuminant unit is arranged between the second illuminant units.

4. The illuminant module of claim 1, wherein the second phosphor layer covers the second LED dice and the current regulator.

5. The illuminant module of claim 4, further comprising at least one surrounding wall disposed on the substrate, the first LED dice and the first phosphor are disposed within the surrounding wall.

6. The illuminant module of claim 1, further comprising a dam disposed on the substrate and surrounds the first illuminant unit, the second illuminant unit, the first phosphor layer, and the second phosphor layer.

7. The illuminant module of claim 1, wherein a waveband of the blue emission from the first LED dice is the same as that of the blue emissions from the second LED dice.

8. The illuminant module of claim 1, wherein the current regulator is a current regulative diode or constant current regulator.

9. A light emitting diode (LED) lamp, comprising:
   an illuminant module, comprising:
   at least one first illuminant unit comprising one or more first light emitting diode (LED) dice and a current regulator electrically connected to the light emitting diode dice in series;
   at least one second illuminant unit comprising one or more second LED dice;

a first phosphor layer at least covering the first LED dice, wherein first phosphor layer and the first LED dice collectively provide an emission having a first color temperature;

a second phosphor layer at least covering the second LED dice, wherein second phosphor layer and the second LED dice collectively provide an emission having a second color temperature, the current regulator is configured to adjust currents flowing to the first illuminant unit and the second illuminant unit for changing luminous flux of emissions emitted from the first illuminant unit and the second illuminant unit to adjust a color temperature of the illuminant module;

a housing, the illuminant module is disposed at the housing;

a shield assembled with the housing, such that the illuminant module is arranged between the housing and the shield;

a heat sink connected to the housing and comprising a plurality of heat-dissipating fins;

an electrical connector connected to the housing; and an electronic circuit module is arranged inside the electrical connector and electrically connected to the illuminant module and the electrical connector;

wherein the first illuminant unit and the second illuminant unit disposed on the substrate, wherein an anode connecting pad, a cathode connecting pad, a first wiring, and a second wiring are mount on the substrate, the first wiring is connected to the anode connecting pad, the first LED dice, and the second LED dice, and the second wiring is connected to the cathode connecting pad, the first LED dice, and the second LED dice, the resistance of the first wiring is equal to the resistance of the second wiring.

10. The LED lamp of claim 9, wherein the first phosphor layer covers the first LED dice and the current regulator.

11. The LED lamp of claim 9, wherein the illuminant module comprises a plurality of second illuminant units, and the first illuminant unit is arranged between the second illuminant units.

12. The LED lamp of claim 9, wherein the second phosphor layer covers the second LED dice and the current regulator.

13. The LED lamp of claim 12, further comprising at least one surrounding wall disposed on the substrate, the first LED dice and the first phosphor are disposed within the surrounding wall.

14. The LED lamp of claim 9, further comprising a dam disposed on the substrate and surrounds the first illuminant unit, the second illuminant unit, the first phosphor layer, and the second phosphor layer.

15. The LED lamp of claim 9, wherein a waveband of the blue emission from the first LED dice is the same as that of the blue emissions from the second LED dice.

16. The LED lamp of claim 9, wherein the current regulator is a current regulative diode or constant current regulator.

* * * * *